(12) United States Patent
Wu

(10) Patent No.: US 10,910,172 B2
(45) Date of Patent: Feb. 2, 2021

(54) THIN PHOTOELECTRIC MECHANICAL KEYBOARD SWITCH

(71) Applicant: Dongguan City Kaihua Electronics Co., Ltd, Dongguan (CN)

(72) Inventor: FuXi Wu, Dongguan (CN)

(*) Notice: Subject to any disclaimer, the term of this patent is extended or adjusted under 35 U.S.C. 154(b) by 8 days.

(21) Appl. No.: 16/413,634

(22) Filed: May 16, 2019

(65) Prior Publication Data
US 2019/0267200 A1 Aug. 29, 2019

Related U.S. Application Data

(63) Continuation of application No. PCT/CN2017/110848, filed on Nov. 14, 2017.

(30) Foreign Application Priority Data

Nov. 17, 2016 (CN) .......................... 2016 1 1027084

(51) Int. Cl.
*H01H 13/14* (2006.01)
*H01H 13/70* (2006.01)
(Continued)

(52) U.S. Cl.
CPC ............ *H01H 13/14* (2013.01); *H01H 3/125* (2013.01); *H01H 13/7006* (2013.01); *H03K 17/969* (2013.01)

(58) Field of Classification Search
CPC ........ H01H 15/02; H01H 15/06; H01H 1/242; H01H 13/12; H01H 13/28; H01H 13/48;
(Continued)

(56) References Cited

U.S. PATENT DOCUMENTS 4,950,856 A * 8/1990 Valenzona ........... H01H 13/023
200/276.1
10,431,402 B2 * 10/2019 Hsieh .................... H01H 13/04
(Continued)

FOREIGN PATENT DOCUMENTS

CN 104299827 A 1/2015
CN 205050718 A 2/2016
(Continued)

OTHER PUBLICATIONS

International search report of WO2018090897A1.

*Primary Examiner* — Ahmed M Saeed
(74) *Attorney, Agent, or Firm* — ZANIP (57) ABSTRACT

A thin photoelectric mechanical keyboard switch includes a printed circuit board (PCB), a base, and a keycap. A first accommodation slot, a second accommodation slot, and a surrounding slot are provided at the base. A balancing frame is disposed in the surrounding slot. A torsion spring is arranged in the first accommodation slot. An upper through hole is provided at a bottom portion of the second accommodation slot, and a blocking piece, a hanging piece, a tension spring, and a guiding core are disposed in the second accommodation slot. One end of the tension spring is fastened in the guiding core and connected to the hanging piece, and the other end of the tension spring is connected to the balancing frame. The thin photoelectric mechanical keyboard switch utilizes light to implement turning on and off functions, realizing a thinned design, and enhancing pressing balance performance and stability.

10 Claims, 5 Drawing Sheets

(51) Int. Cl.
*H03K 17/969* (2006.01)
*H01H 3/12* (2006.01)

(58) Field of Classification Search
CPC ........ H01H 13/52; H01H 13/56; H01H 13/20; H01H 13/36; H01H 13/365; H01H 13/14; H01H 3/125; H01H 13/7065; H01H 2221/044; H01H 2221/036
See application file for complete search history.

(56) References Cited

U.S. PATENT DOCUMENTS

| | | | |
|---|---|---|---|
| 2017/0011871 A1* | 1/2017 | Izawa | H01H 13/807 |
| 2017/0221653 A1* | 8/2017 | Liao | H01H 13/023 |
| 2018/0006648 A1* | 1/2018 | Liu | H01H 13/85 |
| 2019/0267200 A1* | 8/2019 | Wu | H01H 13/14 |

FOREIGN PATENT DOCUMENTS

| | | |
|---|---|---|
| CN | 206180999 A | 5/2017 |
| CN | 107017870 A | 8/2017 |
| TW | 201316368 A | 4/2013 |

* cited by examiner

THIN PHOTOELECTRIC MECHANICAL KEYBOARD SWITCH

TECHNICAL FIELD

The present disclosure relates to a keyboard switch, in particular to a thin photoelectric mechanical keyboard switch.

BACKGROUND

The photoelectric switch is an abbreviation of photoelectric proximity switch, which is a device that uses an object to block or reflect a light beam, to change the light receiving state of the photoelectric sensor, and thereby turn on or off the circuit. The photoelectric switch is mainly used in the fields of object detection, counting, illumination intensity sensing and color recognition and so on. With the development of photoelectron technology and the reduction of related device costs, photoelectric switches have replaced ordinary contact switches in some areas, such as photoelectric keyboard switches instead of contact keyboard switches.

Compared with the ordinary contact keyboard switch, the photoelectric keyboard switch has the advantages of fast response speed and long service life, but the existing photoelectric keyboard switch still has the following problems:
1. The thickness is large, and it is difficult to realize the development of thin products;
2. In the process of use, the poor balance performance and the bad stability results in unsmooth use and affect normal use.

SUMMARY OF THE DISCLOSURE

In view of the above-mentioned deficiencies, an object of the present disclosure is to provide a thin photoelectric mechanical keyboard switch which realizes the thinning of a product while achieving the on-and-off function by using light, and at the same time, improving the balance and press stability.

The technical solution adopted by the present disclosure to achieve the above object is:

A thin photoelectric mechanical keyboard switch, includes a printed circuit board (PCB), a base provided on the printed circuit board, and a keycap provided on the base; wherein a first accommodation slot and a second accommodation slot are provided on the base, and a surrounding slot are surrounded at an edge of an upper end of the base. Therein, a balancing frame is disposed in the surrounding slot. A torsion spring is arranged in the first accommodation slot. An upper through hole is provided at a bottom portion of the second accommodation slot, and a blocking piece, a hanging piece, a tension spring, and a guiding core are disposed in the second accommodation slot. One end of the tension spring is stuck in the guiding core and connected to the hanging piece, and the other end of the tension spring is connected to the balancing frame. An insertion portion is provided at a lower end of the guiding core, the insertion portion consists of two pieces of insertion plates. A lower opening is formed between the two pieces of insertion plates for fitting the tension spring. Communication holes are provided at the two pieces of insertion plates, respectively. A lower through hole corresponding to the upper through hole is provided at the printed circuit board. A light-emitting tube and a light-receiving tube are correspondingly provided at an edge of the lower through hole on the printed circuit board, the guiding core slides vertically along a direction of the upper through hole and the lower through hole.

As a further improvement of the present disclosure, the guiding core includes a guiding core base, and the guiding core base is connected to an upper end of the insertion portion. One side of the guiding core base is provided with a limiting block; a limiting slot for the limiting block to be inserted is provided at a side of the second receiving slot.

As a further improvement of the present disclosure, a cover is disposed between the base and the keycap, and the cover is provided with an opening through which the guiding core passes.

As a further improvement of the present disclosure, a first draw hook is provided at one end of the tension spring and a second draw hook is provided at the other end of the tension spring. The first draw hook is hooked on the hanging piece, and the second draw hook is hooked on the balancing frame.

As a further improvement of the present disclosure, the hanging piece is provided with a hanging piece opening. A latching position is formed on a back side of the hanging piece opening, wherein the whole shape of the hanging piece opening is U-shaped; and the tension spring is located on an interior of the hanging piece opening, the first draw hook of the tension spring is stuck on the latching position.

As a further improvement of the present disclosure, the blocking piece is provided with a blocking piece opening, wherein the whole shape of the blocking piece opening is U-shaped, and the blocking piece opening is disposed upward, so as to the second draw hook of the tension spring is located above the blocking piece opening.

As a further improvement of the present disclosure, the balancing frame is an X-shaped frame, and comprises a U-shaped left bracket and a U-shaped right bracket, wherein an open end of the U-shaped left bracket and an open end of the U-shaped right bracket are arranged to be crossed, and a front end fixing leg of the U-shaped left bracket and a front end fixing leg of the U-shaped right bracket are respectively fixed in the surrounding slot. A rear end fixing leg of the U-shaped left bracket and a rear end fixing leg of the U-shaped right bracket are fixedly connected to a lower end of the keycap.

As a further improvement of the present disclosure, a fixing piece is disposed on the base.

As a further improvement of the present disclosure, the base is provided with a third receiving slot, and the third receiving slot is provided with a static piece.

As a further improvement of the present disclosure, the printed circuit board is provided with a fixing piece insertion hole for inserting a lower end of a fixing piece, and a static piece insertion hole for inserting a lower end of the static piece.

The beneficial effects of the present disclosure are as below:
1. Through the combination of the X-shaped balancing frame and the tension spring, the balance of the keyboard switch is further enhanced, and the structure design is more stable and smoother than the traditional single balance bar.
2. By using a guiding core to control the torsion spring to strike the base, so as to achieve the sound and increase the feel;
3. Through the arrangement of the light-emitting tube and the light-receiving tube on the PCB board, combined with the arrangement of the communication hole at the lower end of the guiding core, a light-conducting channel is formed between the light-emitting tube, the communication hole and the light-receiving tube, thereby realizing the conduction function of the keyboard switch. With the movement of the guiding core, when the light-conducting channel cannot be formed between the guiding core, the light-emitting tube and the light-receiving tube, the disconnection function of the keyboard switch is realized.

The above description is an overview of the technical solutions of the present disclosure, and the present disclosure will be further described below in conjunction with the accompanying drawings and specific embodiments.

DETAILED DESCRIPTION OF THE EMBODIMENTS

In order to further elaborate the technical means and functions adopted by the present disclosure to achieve the intended purpose, the specific implementation of the present disclosure is described in detail below in conjunction with the drawings and preferred embodiments.

Please refer to FIG. 1 to FIG. 6, the present embodiment of the present disclosure provides a thin photoelectric mechanical keyboard switch, including a printed circuit board 1 (PCB), a base 2 provided on the printed circuit board 1, and a keycap 3 provided on the base 2. A first accommodation slot 21 and a second accommodation slot 22 are provided on the base 2, and a surrounding slot 23 are surrounded at an edge of an upper end of the base 2. Wherein a balancing frame 4 is disposed in the surrounding slot 23, a torsion spring 5 is arranged in the first accommodation slot 21, an upper through hole is provided at a bottom portion of the second accommodation slot 22, and a blocking piece 6, an hanging piece 7, a tension spring 8, and a guiding core 9 are disposed in the second accommodation slot 22. One end of the tension spring 8 is stucked in the guiding core 9 and connected to the hanging piece 7, and the other end of the tension spring 8 is connected to the balancing frame 4. An insertion portion 91 is provided at a lower end of the guiding core 9, the insertion portion 91 consists of two pieces of insertion plates 911. A lower opening 94 is formed between the two pieces of insertion plates 911 for fitting the tension spring 8. Communication holes 912 are provided at the two pieces of insertion plates 911, respectively. A lower through hole 11 corresponding to the upper through hole is provided at the printed circuit board 1. A light-emitting tube 12 and a light-receiving tube 13 are correspondingly provided at an edge of the lower through hole 11 on the printed circuit board 1, the guiding core 9 slides up and down along a direction of the upper through hole and the lower through hole 11.

Figure 3:
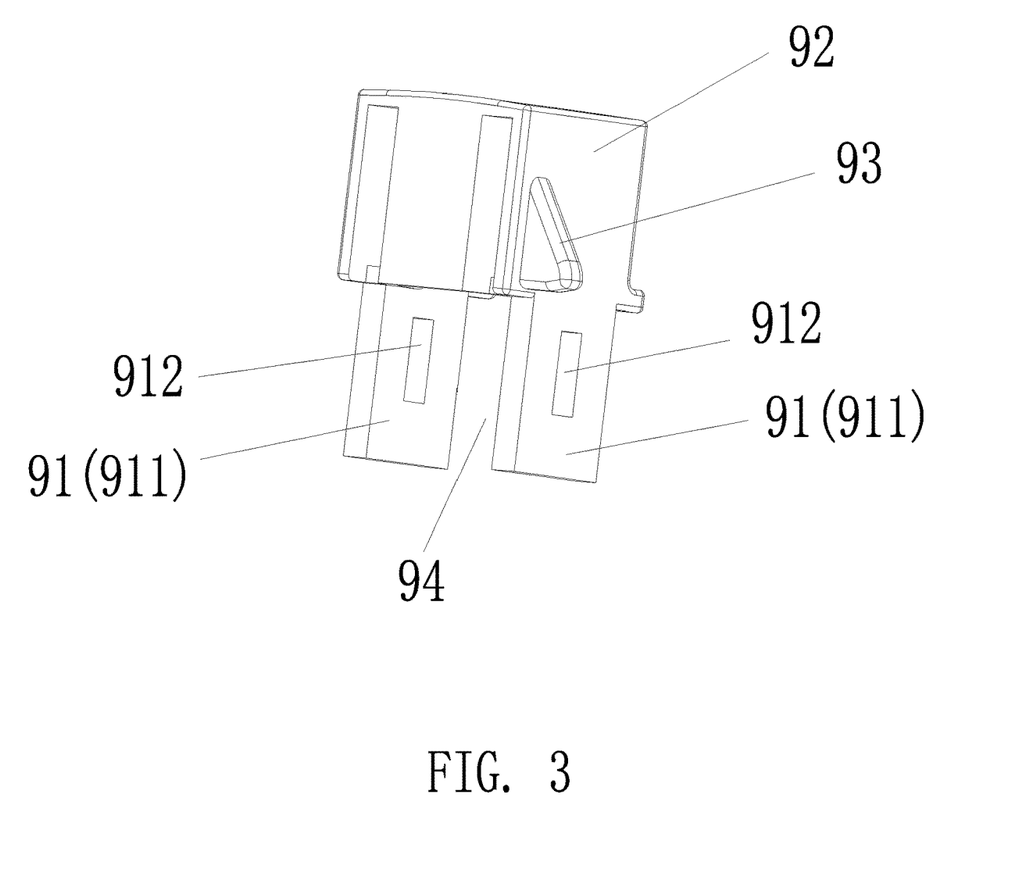
FIG. 3 is a schematic structural view of a guiding core of the present disclosure.

As shown in FIG. 3, the guiding core 9 includes a guiding core base 92, and the guiding core base 92 is connected to an upper end of the insertion portion 91, and a side of the guiding core base 92 is provided with a limiting block 93. A limiting slot 222 for the limiting block 93 to be inserted is provided at a side of the second receiving slot 22. When the guiding core 9 is pressed to move downward, by engaging the limiting block 93 into the limiting slot 222, the guiding core 9 is prevented from being excessively disengaged from the base 2, to ensure the guiding core 9 moving up and down within a certain vertical range.

Figure 1:
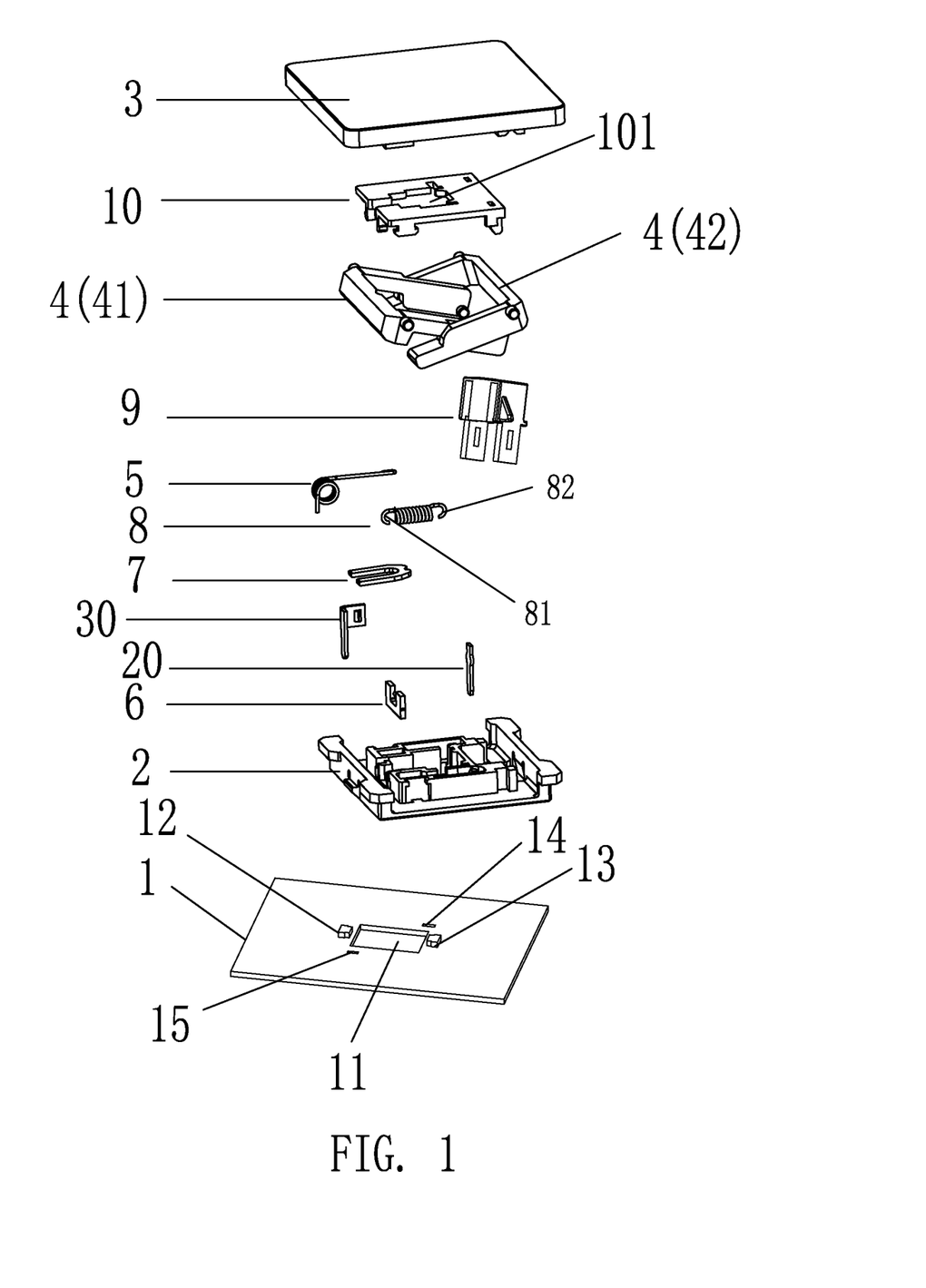
FIG. 1 is an exploded view of the present disclosure.

As shown in FIG. 1, a cover 10 is disposed between the base 2 and the keycap 3. The cover 10 is used to conduct positioning of the torsion spring 5 and the tension spring 8 to prevent the structure of the torsion spring 5 and the tension spring 8 from separating from the base 2 during pressing. The cover 10 is provided with an opening 101 through which the guiding core 9 passes. The guiding core 9 moves up and down in the opening 101 during pressing. In the present embodiment, the cover 10 is provided with a plastic cover to better insulate the conductive components. At the same time, a fixing piece 20 is further disposed on the base 2.

Figure 6:
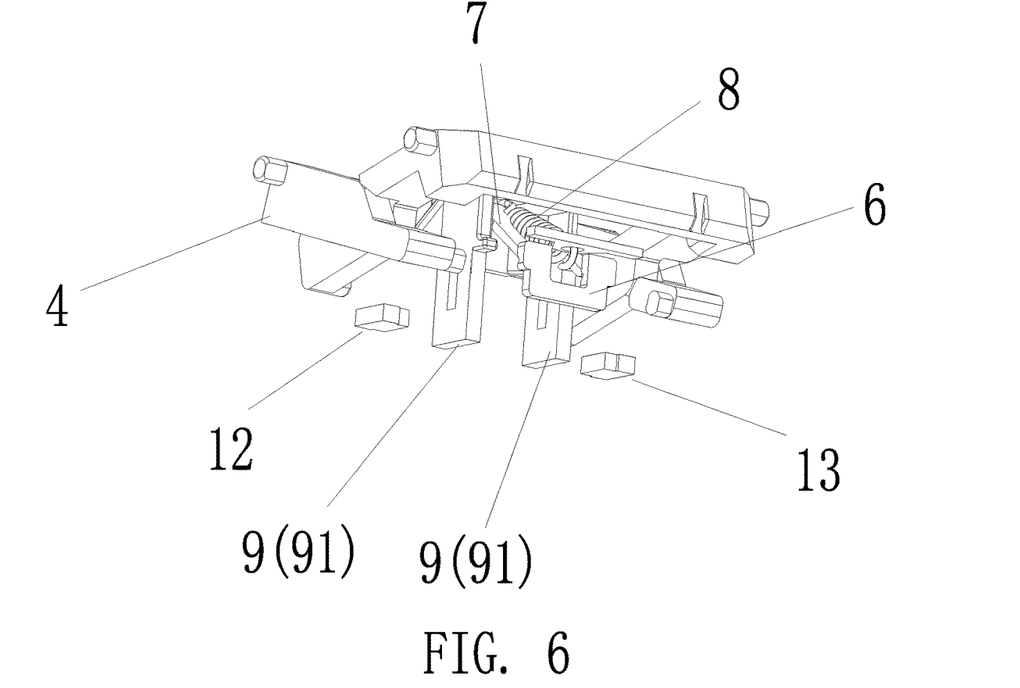
FIG. 6 is a partial structural view of the present disclosure.

As shown in FIGS. 1 and 6, a first draw hook 81 is provided at one end of the tension spring 8 and a second draw hook 82 is provided at the other end of the tension spring 8, the first draw hook 81 is hooked on the hanging piece 7, and the second draw hook 82 is hooked on the balancing frame 4. By engaging one end of the tension spring 8 to the hanging piece 7 in the guiding core 9, the tension spring 8 has an upward restoring force relative to the guiding core 9, so that the keyboard switch in the pressed state is upward returned to the natural state.

Figure 4:
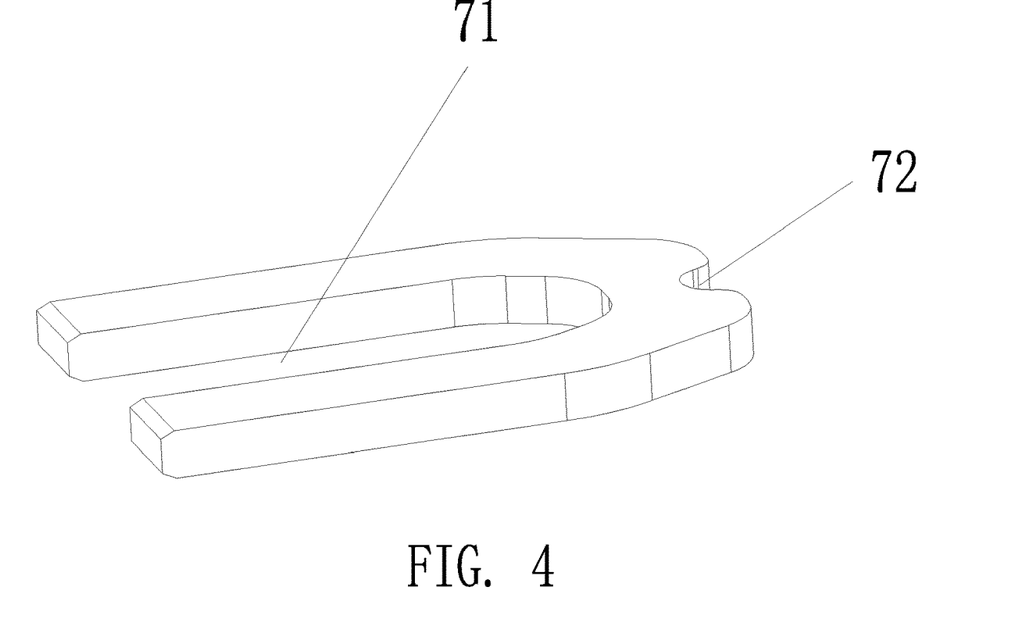
FIG. 4 is a schematic structural view of a hanging piece of the present disclosure.

As shown in FIG. 4, the hanging piece 7 is provided with a hanging piece opening 71; a latching position 72 is formed on a back side of the hanging piece opening 71, wherein the whole shape of the hanging piece opening 71 is U-shaped; and the tension spring 8 is located in an interior of the hanging piece opening 71. The first draw hook 81 of the tension spring 8 is stuck on the latching position 72.

Figure 5:
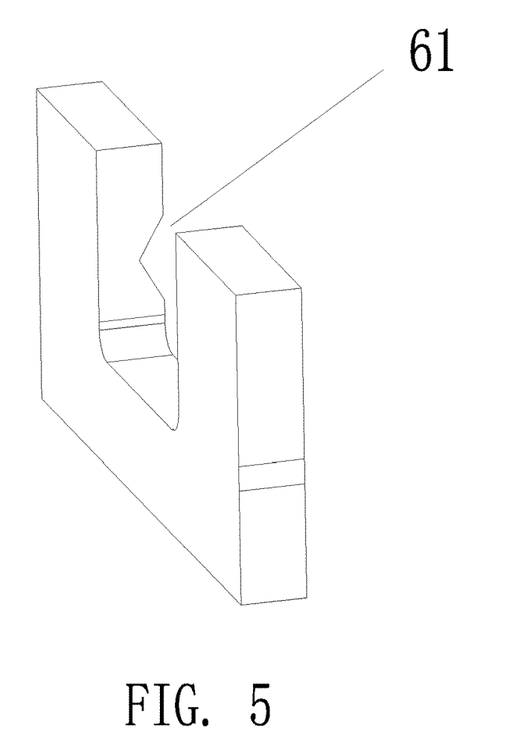
FIG. 5 is a schematic structural view of a blocking piece of the present disclosure.

As shown in FIG. 5, the blocking piece 6 is provided with a blocking piece opening 61, wherein the whole shape of the blocking piece opening 61 is U-shaped, and the blocking piece opening 61 is disposed upward, so as to the second draw hook 82 of the tension spring 8 is located above the blocking piece opening 61.

As shown in FIG. 1, the balancing frame 4 is an X-shaped frame, and includes a U-shaped left bracket 41 and a U-shaped right bracket 42, wherein an open end of the U-shaped left bracket 41 and an open end of the U-shaped right bracket 42 are crossed arranged, and a front end fixing leg of the U-shaped left bracket 41 and a front end fixing leg of the U-shaped right bracket 42 are respectively fixed in the surrounding slot 23, and a rear end fixing leg of the U-shaped left bracket 41 and a rear end fixing leg of the U-shaped right bracket 42 are fixedly connected to a lower end of the keycap 3.

Figure 2:
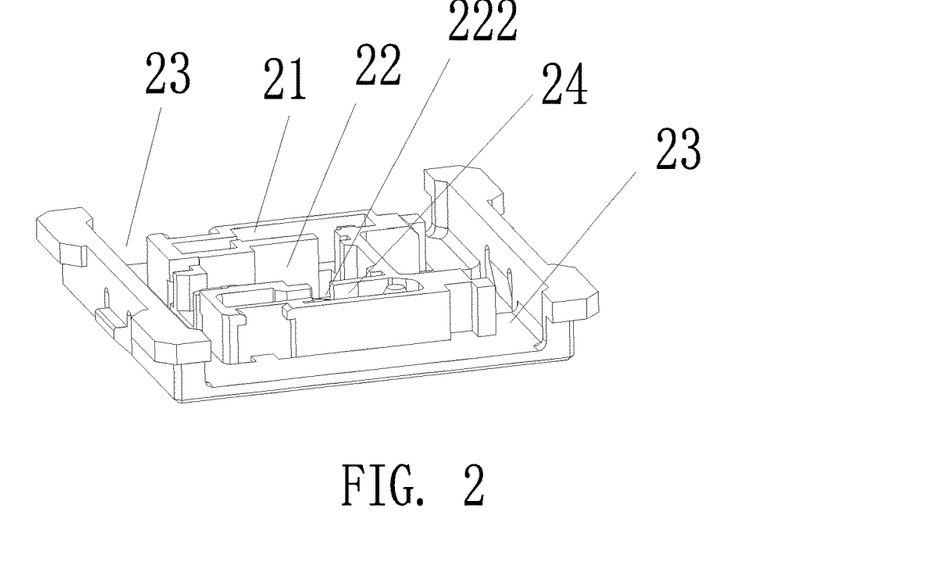
FIG. 2 is a schematic structural view of a base according to the present disclosure.

As shown in FIG. 2, the base 2 is provided with a third receiving slot 24, and a static piece 30 is provided in the third receiving slot 24.

As shown in FIG. 1, the printed circuit board 1 is provided with a fixing piece insertion hole 14 for inserting a lower end of a fixing piece 20, and a static piece insertion hole 15 for inserting a lower end of the static piece 30.

Figure 7:
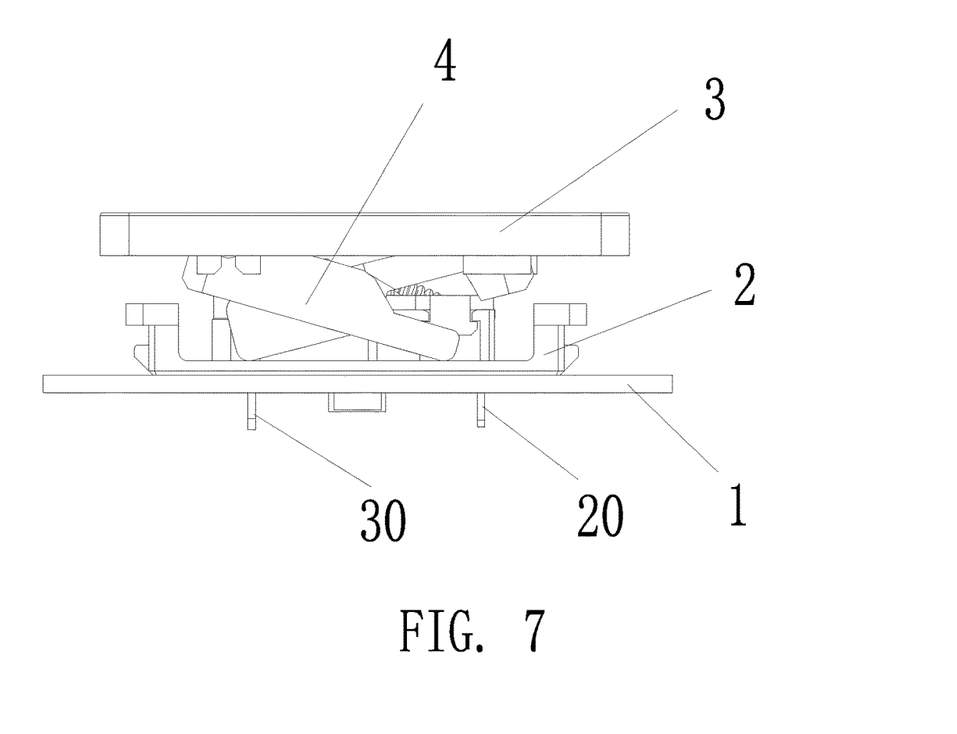
FIG. 7 is a schematic structural view of the keyboard switch of the present disclosure in an unpressed state.
Figure 8:
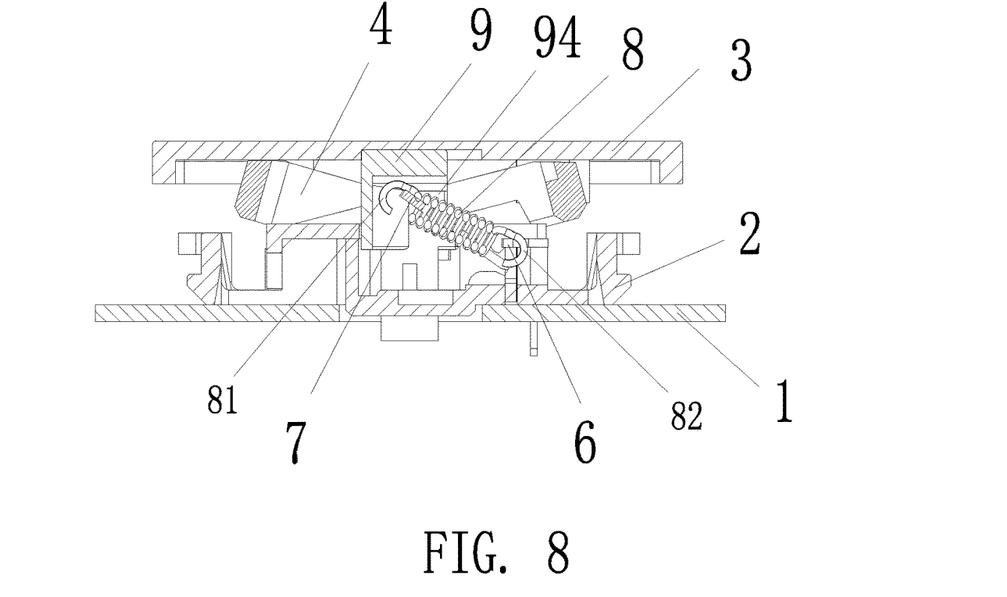
FIG. 8 is a cross-sectional view showing the keyboard switch of the present disclosure in an unpressed state.
Figure 9:
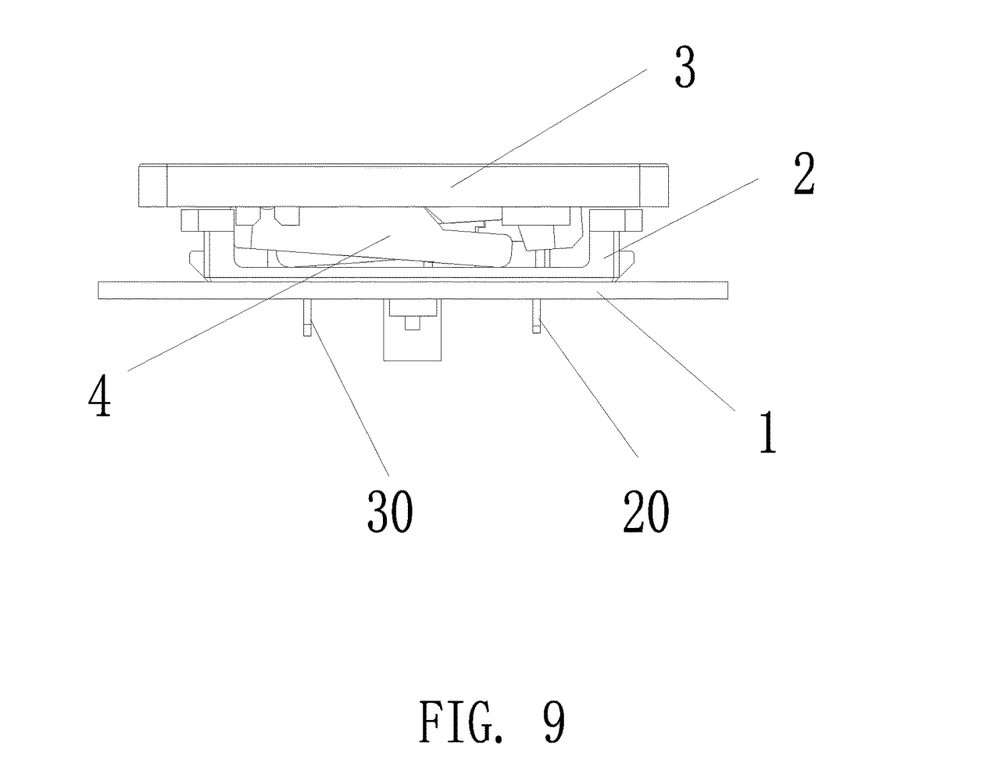
FIG. 9 is a schematic structural view of the keyboard switch of the present disclosure in a state being pressed to a termination.

As shown in FIGS. 7 and 8, which are the structure schematic diagram of keyboard switch in unstressed state, when pressing the keycap 3, the keycap 3 will push the guiding core 9 and the balancing frame 4 to move downward, and the downward movement of the guiding core 9 will drive the torsion spring 5 to move. At the same time, the communication holes 912 on the two pieces of insertion plates 911 of the guiding core 9 are between the light-emitting tube 12 and the light-receiving tube 13 to form the light-conducting channel, so that the light emitting from the light-emitting tube 12 can be transmitted to the light-receiving tube 13 through two communication holes 912 to realize the connecting function of the keyboard switch. FIG. 9 is a schematic diagram in a state when the keycap 3 is pressed to the termination. When the pressing force to the keycap 3 disappears, the restoring force of the tension spring 8, to apply an upward force on the guiding core 9 and the guiding core 9 moves upward, which prevents the formation of a light-conducting channel between the guiding core 9, the light-emitting tube 12 and the light-receiving tube 13. The keyboard switch in the pressing state returns upward to its natural state. At the same time, the restoring force of the torsion spring 5 strikes the base 2 to make a sound and raise the press feel, so that the disconnecting function of the keyboard switch is realized.

The main focus of the present disclosure is shown as below:

1. Through the combination of the X-shaped balancing frame and the tension spring, the balance of the keyboard switch is further enhanced, and the structure design is more stable and smoother than the traditional single balance bar.
2. By using a guiding core to control the torsion spring to strike the base, so as to achieve the sound and increase the feel;
3. Through the arrangement of the light-emitting tube and the light-receiving tube on the PCB board, combined with the arrangement of the communication hole at the lower end of the guiding core, a light-conducting channel is formed between the light-emitting tube, the communication hole and the light-receiving tube, thereby realizing the conduction function of the keyboard switch. With the movement of the guiding core, when the light-conducting channel cannot be formed between the guiding core, the light-emitting tube and the light-receiving tube, the disconnecting function of the keyboard switch is realized.

The above description is only a preferred embodiment of the present disclosure, and is not intended to limit the technical scope of the present disclosure. Therefore, other configurations obtained by using the same or similar technical features as the above-described embodiments of the present disclosure are all within the protection scope of the present disclosure.

What is claimed is:

1. A thin photoelectric mechanical keyboard switch, comprising a printed circuit board (PCB), a base provided on the printed circuit board, and a keycap provided on the base;
   wherein a first accommodation slot and a second accommodation slot are provided on the base, and a surrounding slot is surrounded at an edge of an upper end of the base;
   wherein a balancing frame is disposed in the surrounding slot, a torsion spring is arranged in the first accommodation slot, an upper through hole is provided at a bottom portion of the second accommodation slot, and a blocking piece, an hanging piece, a tension spring, and a guiding core are disposed in the second accommodation slot; one end of the tension spring is stucked in the guiding core and connected to the hanging piece, and the other end of the tension spring is connected to the balancing frame; an insertion portion is provided at a lower end of the guiding core, the insertion portion consists of two pieces of insertion plates, a lower opening is formed between the two pieces of insertion plates for fitting the tension spring; communication holes are provided at the two pieces of insertion plates, respectively; a lower through hole corresponding to the upper through hole is provided at the printed circuit board; a light-emitting tube and a light-receiving tube are correspondingly provided at an edge of the lower through hole on the printed circuit board, the guiding core slides up and down along a direction of the upper through hole and the lower through hole.

2. The thin photoelectric mechanical keyboard switch, according to claim 1, wherein the guiding core comprises a guiding core base, and the guiding core base is connected to an upper end of the insertion portion, and a side of the guiding core base is provided with a limiting block; a limiting slot for the limiting block to be inserted is provided at a side of the second receiving slot.

3. The thin photoelectric mechanical keyboard switch, according to claim 1, wherein a cover is disposed between the base and the keycap, and the cover is provided with an opening through which the guiding core passes.

4. The thin photoelectric mechanical keyboard switch, according to claim 1, wherein a first draw hook is provided at one end of the tension spring and a second draw hook is provided at the other end of the tension spring, the first draw hook is hooked on the hanging piece, and the second draw hook is hooked on the balancing frame.

5. The thin photoelectric mechanical keyboard switch, according to claim 4, wherein the hanging piece is provided with a hanging piece opening; a latching position is formed on a back side of the hanging piece opening, wherein the whole shape of the hanging piece opening is U-shaped; and the tension spring is located on an interior of the hanging piece opening, the first draw hook of the tension spring is stucked on the latching position.

6. The thin photoelectric mechanical keyboard switch, according to claim 4, wherein the blocking piece is provided with a blocking piece opening, wherein the whole shape of the blocking piece opening is U-shaped, and the blocking piece opening is disposed upward, so as to the second draw hook of the tension spring is located above the blocking piece opening.

7. The thin photoelectric mechanical keyboard switch, according to claim 1, wherein the balancing frame is an X-shaped frame, and comprises a U-shaped left bracket and a U-shaped right bracket, wherein an open end of the U-shaped left bracket and an open end of the U-shaped right bracket are arranged to be crossed, and a front end fixing leg of the U-shaped left bracket and a front end fixing leg of the U-shaped right bracket are respectively fixed in the surrounding slot, and a rear end fixing leg of the U-shaped left bracket and a rear end fixing leg of the U-shaped right bracket are fixedly connected to a lower end of the keycap.

8. The thin photoelectric mechanical keyboard switch, according to claim 1, wherein a fixing piece is disposed on the base.

9. The thin photoelectric mechanical keyboard switch, according to claim 8, wherein the base is provided with a third receiving slot, and a static piece is provided in the third receiving slot.

10. The thin photoelectric mechanical keyboard switch, according to claim 1, wherein the printed circuit board is provided with a fixing piece insertion hole for inserting a lower end of a fixing piece, and a static piece insertion hole for inserting a lower end of the static piece.

\* \* \* \* \*